(12) United States Patent
Shiraishi

(10) Patent No.: US 12,211,541 B2
(45) Date of Patent: Jan. 28, 2025

(54) MEMORY CONTROLLER, CONTROL METHOD FOR MEMORY CONTROLLER, AND STORAGE MEDIUM

(71) Applicant: CANON KABUSHIKI KAISHA, Tokyo (JP)

(72) Inventor: Daisuke Shiraishi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 18/051,811

(22) Filed: Nov. 1, 2022

(65) Prior Publication Data

US 2023/0133458 A1  May 4, 2023

(30) Foreign Application Priority Data

Nov. 2, 2021 (JP) ................................. 2021-179351

(51) Int. Cl.
*G11C 11/406* (2006.01)
*G11C 11/4078* (2006.01)

(52) U.S. Cl.
CPC .. *G11C 11/40618* (2013.01); *G11C 11/40615* (2013.01); *G11C 11/4078* (2013.01)

(58) Field of Classification Search
CPC ........ G11C 11/40618; G11C 11/40615; G11C 11/4078
See application file for complete search history.

(56) References Cited

U.S. PATENT DOCUMENTS

| | | | | |
|---|---|---|---|---|
| 9,355,704 B2* | 5/2016 | Lai | ..................... | G11C 11/40618 |
| 9,767,050 B2* | 9/2017 | Doo | .................. | G11C 11/40611 |
| 9,773,541 B1* | 9/2017 | Choi | ................... | G11C 11/4085 |
| 10,777,252 B2* | 9/2020 | Fu | .......................... | G06F 13/10 |

FOREIGN PATENT DOCUMENTS

| | | |
|---|---|---|
| JP | 2013008112 A | 1/2013 |
| JP | 2015035229 A | 2/2015 |

* cited by examiner

*Primary Examiner* — Son L Mai
(74) *Attorney, Agent, or Firm* — Canon U.S.A., Inc., IP Division

(57) ABSTRACT

In a memory controller, at least one of a plurality of refresh methods varying in refresh target area of a dynamic random access memory (DRAM) is a refresh method of refreshing an entire area of the DRAM, and a specific event that disables access to the entire area of the DRAM occurs in a cycle longer than a refresh execution cycle using the refresh method of refreshing the entire area of the DRAM. The memory controller includes a selection unit configured to select one refresh method from among the plurality of refresh methods, depending on whether the specific event that disables the access to the entire area of the DRAM is to occur in a refresh execution period.

8 Claims, 5 Drawing Sheets

MEMORY CONTROLLER, CONTROL METHOD FOR MEMORY CONTROLLER, AND STORAGE MEDIUM

BACKGROUND OF THE INVENTION

Field of the Invention

The present disclosure relates to a memory controller, a control method for the memory controller, and a storage medium.

Description of the Related Art

A timing adjustment and a calibration between a clock signal and a command signal and between a data strobe signal and a data signal have become important for appropriate communication with a dynamic random access memory (DRAM), in handling recent faster DRAMs. In a case where a timing shift between the signals occurs accompanying a fluctuation in temperature or voltage, a situation where appropriate communication with the DRAM fails occurs. Thus, memory access such as read access and write access to the DRAM is stopped regularly to execute the timing adjustment and the calibration between the signals, but this causes a decrease in memory use efficiency because the memory access is disabled during the execution.

To address this issue, there have been devised methods of preventing the decrease in memory use efficiency by executing the timing adjustment and the calibration during a refresh execution period in which the memory access is disabled likewise.

Japanese Patent Application Laid-Open No. 2013-8112 discusses a memory controller that controls at least one delay amount to become close to a reference delay amount, in a period corresponding to a difference between a first burst length (BL) and a second BL of memory data that is caused by switching from the first BL to the second BL.

Japanese Patent Application Laid-Open No. 2015-35229 discusses a semiconductor device including a data output buffer for writing data to a memory device, and a data input buffer for reading data from the memory device and connecting to the data output buffer in a first loopback path.

In recent years, however, there has been a trend to use per-bank refresh to perform refresh for each of a plurality of regions forming the DRAM, instead of using all-bank refresh to refresh all the regions of the DRAM, in order to further improve the memory use efficiency. In the per-bank refresh, memory access to the regions except for the region where the refresh is executed is enabled, and disablement of memory access to all the regions of the DRAM due to the refresh does not occur. For this reason, it is difficult to perform the timing adjustment and the calibration in the refresh execution period as before.

SUMMARY OF THE INVENTION

The present disclosure is directed to a technique capable of inhibiting a reduction in memory use efficiency by selecting an appropriate refresh method from among a plurality of dynamic random access memory (DRAM) refresh methods.

According to an aspect of the present disclosure, a memory controller where at least one of a plurality of refresh methods varying in refresh target area of a dynamic random access memory (DRAM) is a refresh method of refreshing an entire area of the DRAM, and where a specific event that disables access to the entire area of the DRAM occurs in a cycle longer than a refresh execution cycle using the refresh method of refreshing the entire area of the DRAM includes a selection unit configured to select one refresh method from among the plurality of refresh methods, depending on whether the specific event that disables the access to the entire area of the DRAM is to occur in a refresh execution period.

Further features of the present disclosure will become apparent from the following description of exemplary embodiments with reference to the attached drawings.

DESCRIPTION OF THE EMBODIMENTS

Figure 1:
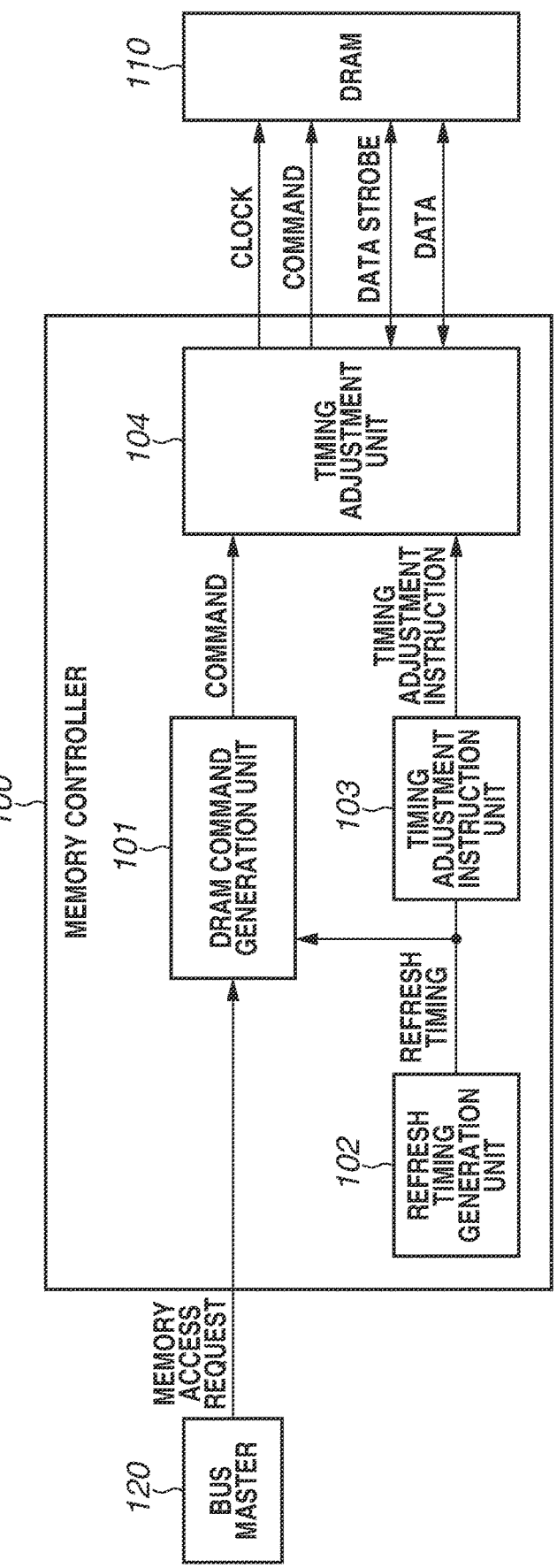
FIG. 1 is a diagram illustrating an example of a configuration of a memory controller.

FIG. 1 is a diagram illustrating an example of a configuration of a memory controller 100 according to a first exemplary embodiment. The memory controller 100 is connected to a dynamic random access memory (DRAM) 110 and a bus master 120. The bus master 120 transmits a memory access request including address information and write data to the memory controller 100. The memory controller 100 generates a DRAM command based on the memory access request received from the bus master 120, and transmits the DRAM command to the DRAM 110. Further, the memory controller 100 transfers data to the DRAM 110 based on the transmitted DRAM command. The DRAM 110 has a plurality of regions (a plurality of banks) and is capable of executing all-bank refresh of refreshing all the regions (all the banks) at a time and per-bank refresh of refreshing any of the regions (any of the banks). When executing the all-bank refresh in the middle of refreshing all the banks by executing the per-bank refresh a plurality of times, the DRAM 110 can refresh all the remaining banks that have not been refreshed in the per-bank refresh.

The DRAM 110 includes a storage element including a capacitor and a transistor, and stores data into the storage element, using a value of "1" indicating a state where electric charge is accumulated in the storage element and a value of "0" indicating a state where electric charge is not accumulated in the storage element. The charge amount of the storage element decreases with time, and thus it is desirable for the DRAM 110 to perform refresh (rewrite data) regularly to prevent loss of data.

The memory controller 100 includes a DRAM command generation unit 101, a refresh timing generation unit 102, a timing adjustment instruction unit 103, and a timing adjustment unit 104.

The DRAM command generation unit 101 generates a read/write command to be transmitted to the DRAM 110, based on the memory access request received from the bus master 120. The DRAM command generation unit 101 also generates a refresh command for refreshing the DRAM 110.

The refresh timing generation unit 102 generates a refresh timing signal for executing the per-bank refresh. The refresh timing generation unit 102 measures an execution cycle of the per-bank refresh requested by the DRAM 110, and transmits the refresh timing signal to the DRAM command generation unit 101 and the timing adjustment instruction unit 103 each time the refresh timing generation unit 102 measures the execution cycle.

The timing adjustment instruction unit 103 generates a timing adjustment instruction for instructing the timing adjustment unit 104 to execute a timing adjustment and a calibration. In the present exemplary embodiment, the timing adjustment and the calibration are executed in a cycle of an integral multiple (N times) of the execution cycle of the per-bank refresh. Each time the timing adjustment instruction unit 103 receives N refresh timing signals from the refresh timing generation unit 102, the timing adjustment instruction unit 103 transmits a timing adjustment instruction to the timing adjustment unit 104.

The timing adjustment unit 104 receives the timing adjustment instruction from the timing adjustment instruction unit 103. Then, the timing adjustment unit 104 executes the timing adjustment and the calibration between a clock signal and a command signal and between a data strobe signal and a data signal in order to communicate with the DRAM 110 appropriately. The timing adjustment unit 104 transmits the clock signal and the command signal to the DRAM 110. Further, the timing adjustment unit 104 transmits and receives the data strobe signal and the data signal to and from the DRAM 110.

The data strobe signal indicates a timing to read data or a timing to write data in response to the read/write command.

The DRAM command generation unit 101 generates either a per-bank refresh command or an all-bank refresh command if the DRAM command generation unit 101 receives a refresh timing signal from the refresh timing generation unit 102 and it is desirable to issue a refresh command.

Upon receiving N refresh timing signals, i.e., the refresh timing signals of the number corresponding to the timing for generating a timing adjustment instruction, the DRAM command generation unit 101 generates an all-bank refresh command. Otherwise, the DRAM command generation unit 101 generates a per-bank refresh command.

Figure 2:
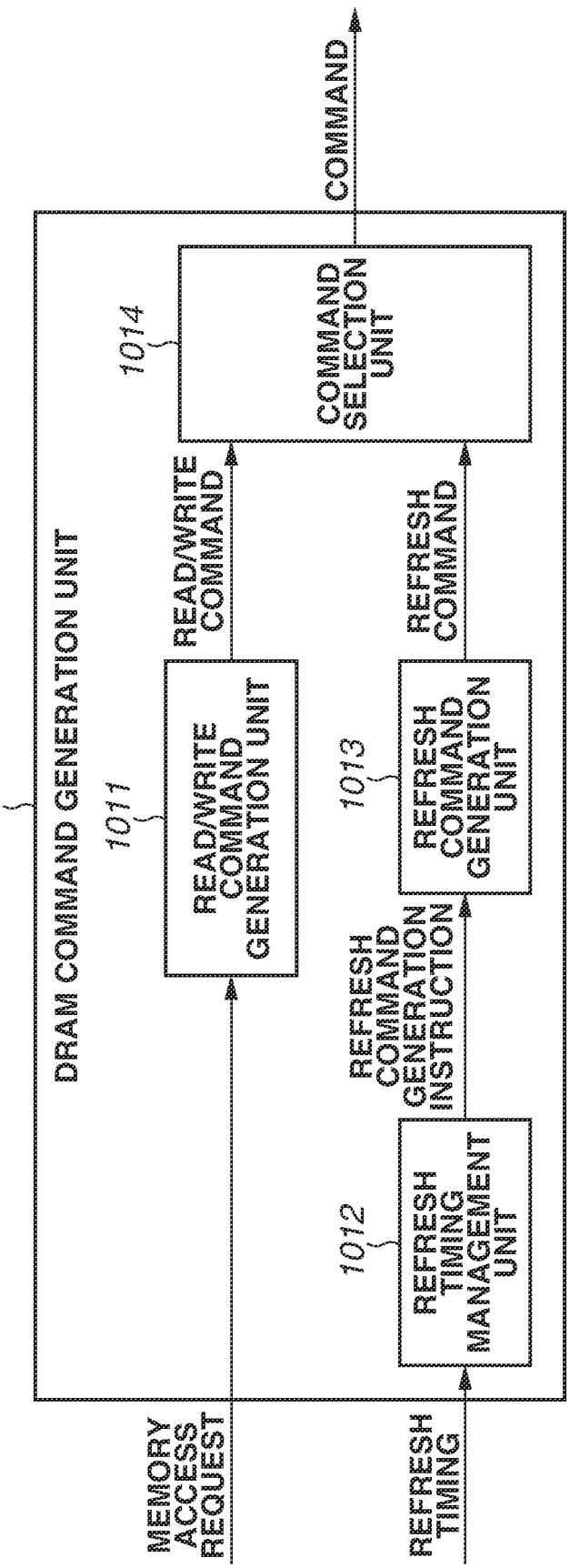
FIG. 2 is a diagram illustrating an example of a configuration of a dynamic random access memory (DRAM) command generation unit.

FIG. 2 is a diagram illustrating an example of a configuration of the DRAM command generation unit 101 according to the present exemplary embodiment. The DRAM command generation unit 101 includes a read/write command generation unit 1011, a refresh timing management unit 1012, a refresh command generation unit 1013, and a command selection unit 1014.

The read/write command generation unit 1011 generates a read/write command to be transmitted to the DRAM 110, based on the memory access request received from the bus master 120.

The refresh timing management unit 1012 includes a timing adjustment detection counter and a per-bank refresh control counter. The timing adjustment detection counter is used to detect whether the timing adjustment is to be executed based on a received refresh timing signal. The initial value of the timing adjustment detection counter is 0, and the timing adjustment detection counter counts up upon receipt of a refresh timing signal, and is cleared to 0 when the number of received refresh timing signals reaches N.

The per-bank refresh control counter is used to control issuing of a per-bank refresh command. The initial value of the per-bank refresh control counter is 0, and the per-bank refresh control counter counts up upon receipt of a refresh timing signal, and is cleared to 0 when the number of received refresh timing signals reaches M. M is a value calculated by dividing the total number of banks of the DRAM 110 by the number of banks to be refreshed by one per-bank refresh command.

A case where the refresh timing management unit 1012 receives a refresh timing signal in a state where the value of the timing adjustment detection counter is smaller than (N−1) will be described. In this case, the refresh timing management unit 1012 transmits a refresh command generation instruction for generating a per-bank refresh command to the refresh command generation unit 1013. In the present exemplary embodiment, a target bank of the per-bank refresh command is specified using the value of the per-bank refresh control counter, but may be specified using a value determined by performing some kind of calculation based on the value of the per-bank refresh control counter.

A case where the refresh timing management unit 1012 receives a refresh timing signal in a state where the value of the timing adjustment detection counter is the same as (N−1) will be described. In this case, the refresh timing management unit 1012 transmits a refresh command generation instruction for generating an all-bank refresh command to the refresh command generation unit 1013.

At this time, in a case where the value of the per-bank refresh control counter is smaller than (M−1), the refresh timing management unit 1012 asserts a refresh command generation instruction mask for masking a refresh command generation instruction. The refresh timing management unit 1012 does not transmit a refresh command generation instruction to the refresh command generation unit 1013 while the refresh command generation instruction mask is asserted. Upon receiving a refresh timing signal in a case where the value of the per-bank refresh control counter is the same as (M−1), the refresh timing management unit 1012 deasserts the refresh command generation instruction mask. The refresh timing management unit 1012 can transmit a refresh command generation instruction to the refresh command generation unit 1013 while the refresh command generation instruction mask is deasserted.

The refresh command generation unit 1013 generates a per-bank refresh command or an all-bank refresh command based on the refresh command generation instruction from the refresh timing management unit 1012.

The command selection unit 1014 selects the read/write command generated by the read/write command generation unit 1011 or the refresh command generated by the refresh command generation unit 1013. Subsequently, the command selection unit 1014 transmits the selected read/write command or refresh command to the DRAM 110 via the timing adjustment unit 104.

Figure 3:
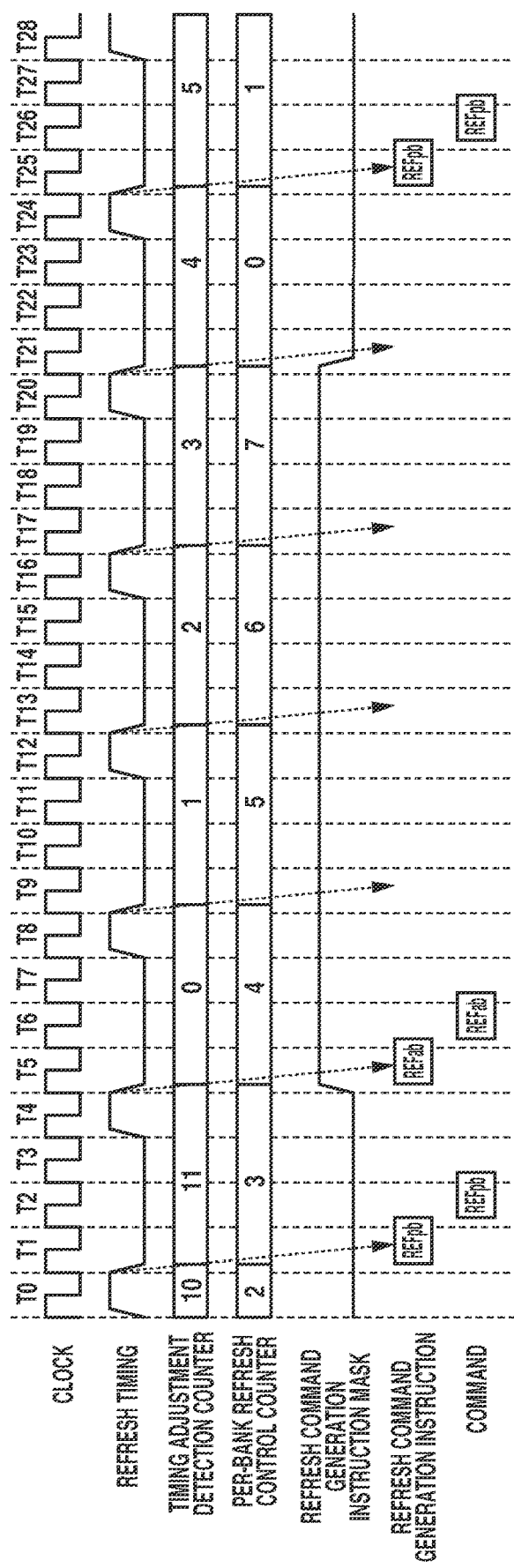
FIG. 3 is a waveform chart illustrating a behavior of the DRAM command generation unit.

FIG. 3 is a waveform chart illustrating a behavior of the DRAM command generation unit 101 according to the present exemplary embodiment. In the example of FIG. 3, the timing adjustment is to be executed in a cycle 12 times (N=12) the execution cycle of the per-bank refresh. In addition, the total number of banks of the DRAM 110 is 8, and the number of banks to be refreshed by one per-bank refresh command is 1. Thus, M=8 is established. A control method for the memory controller 100 will be described next.

At a time T0, the refresh timing management unit 1012 does not receive a refresh timing signal.

At a time T1, the refresh timing management unit 1012 receives a refresh timing signal. The value of the timing adjustment detection counter at the time of the receipt is 10, which is not (N−1), and thus the timing adjustment is not to be executed based on the receipt of the refresh timing signal.

Thus, the refresh timing management unit 1012 transmits a refresh command generation instruction for generating a per-bank refresh command to the refresh command generation unit 1013. Upon receiving the refresh command generation instruction for generating a per-bank refresh command, the refresh command generation unit 1013 generates a per-bank refresh command.

At times T2 to T4, the refresh timing management unit 1012 does not receive a refresh timing signal.

At a time T5, the refresh timing management unit 1012 receives a refresh timing signal. The value of the timing adjustment detection counter at the time of the receipt is 11, which is (N−1), and thus the timing adjustment is to be executed based on the receipt of the refresh timing signal. Accordingly, the refresh timing management unit 1012 transmits a refresh command generation instruction for generating an all-bank refresh command to the refresh command generation unit 1013. Upon receiving the refresh command generation instruction for generating an all-bank refresh command, the refresh command generation unit 1013 generates an all-bank refresh command. In addition, the value of the per-bank refresh control counter at the time of the receipt is 3, which is not (M−1), and thus the refresh timing management unit 1012 asserts the refresh command generation instruction mask.

At times T6 to T8, the refresh timing management unit 1012 does not receive a refresh timing signal.

At a time T9, the refresh timing management unit 1012 receives a refresh timing signal, but does not transmit a refresh command generation instruction to the refresh command generation unit 1013 because the refresh command generation instruction mask is asserted.

At times T10 to T12, the refresh timing management unit 1012 does not receive a refresh timing signal.

At a time T13, the refresh timing management unit 1012 receives a refresh timing signal, but does not transmit a refresh command generation instruction to the refresh command generation unit 1013 because the refresh command generation instruction mask is asserted.

At times T14 to T16, the refresh timing management unit 1012 does not receive a refresh timing signal.

At a time T17, the refresh timing management unit 1012 receives a refresh timing signal, but does not transmit a refresh command generation instruction to the refresh command generation unit 1013 because the refresh command generation instruction mask is asserted.

At times T18 to T20, the refresh timing management unit 1012 does not receive a refresh timing signal.

At a time T21, the refresh timing management unit 1012 receives a refresh timing signal, but does not transmit a refresh command generation instruction to the refresh command generation unit 1013 because the refresh command generation instruction mask is asserted. The value of the per-bank refresh control counter at the time of the receipt is 7, which is (M−1), and thus the refresh timing management unit 1012 deasserts the refresh command generation instruction mask based on the receipt of the refresh timing signal.

At times T22 to T24, the refresh timing management unit 1012 does not receive a refresh timing signal.

At a time T25, the refresh timing management unit 1012 receives a refresh timing signal. The value of the timing adjustment detection counter at the time of the receipt is 4, which is not (N−1), and thus the timing adjustment is not to be executed based on the receipt of the refresh timing signal.

Thus, the refresh timing management unit 1012 transmits a refresh command generation instruction for generating a per-bank refresh command to the refresh command generation unit 1013. Upon receiving the refresh command generation instruction for generating a per-bank refresh command, the refresh command generation unit 1013 generates a per-bank refresh command.

At times T26 to T28, the refresh timing management unit 1012 does not receive a refresh timing signal.

In the present exemplary embodiment, the timing adjustment instruction unit 103 generates a timing adjustment instruction for executing the timing adjustment and the calibration. Alternatively, the refresh timing management unit 1012 may transmit a timing adjustment instruction to the timing adjustment unit 104 each time the refresh timing management unit 1012 receives N refresh timing signals from the refresh timing generation unit 102.

As described above, the refresh timing generation unit 102 generates a refresh timing signal in a cycle 4 times the cycle of the clock signal. Each time the timing adjustment instruction unit 103 receives N (=12) refresh timing signals from the refresh timing generation unit 102, the timing adjustment instruction unit 103 transmits a timing adjustment instruction to the timing adjustment unit 104. Upon receiving the timing adjustment instruction from the timing adjustment instruction unit 103, the timing adjustment unit 104 executes the timing adjustment and the calibration between the clock signal and the command signal and between the data strobe signal and the data signal. The timing adjustment and the calibration are to be executed regularly in order to respond to temperature and voltage fluctuations. The execution cycle of the timing adjustment and the calibration is a cycle N times (12 times) the cycle of the refresh timing.

Upon receiving a refresh timing signal, the refresh timing management unit 1012 causes the timing adjustment detection counter and the per-bank refresh control counter to count up. In a case where the value of the timing adjustment detection counter at the time of the receipt is (N−1), the execution timing for the timing adjustment and the calibration arrives. In a case where the value of the timing adjustment detection counter at the time of the receipt is not (N−1), the execution timing for the timing adjustment and the calibration does not arrive.

During the period in which the timing adjustment unit 104 performs the timing adjustment and the calibration, the memory controller 100 is unable to access the DRAM 110.

Since all the banks are refreshed in the all-bank refresh, the memory controller 100 does not access the DRAM 110 during the period in which the DRAM 110 executes the all-bank refresh. Thus, during the period in which the DRAM 110 executes the all-bank refresh, the timing adjustment unit 104 can perform the timing adjustment and the calibration.

In contrast, since the banks are partially refreshed in the per-bank refresh, the memory controller 100 can access an unrefreshed bank of the DRAM 110 during the period in which the DRAM 110 executes the per-bank refresh. Thus, during the period in which the DRAM 110 executes the per-bank refresh, the timing adjustment unit 104 is unable to perform the timing adjustment and the calibration.

In a case where the value of the timing adjustment detection counter is (N−1) when the refresh timing management unit 1012 receives a refresh timing signal, the timing adjustment and the calibration are to be performed. In this case, the refresh timing management unit 1012 transmits a refresh command generation instruction for generating an all-bank refresh command to the refresh command generation unit 1013.

In a case where the value of the timing adjustment detection counter is not (N−1) when the refresh timing management unit 1012 receives a refresh timing signal, the timing adjustment and the calibration are not to be performed. In this case, the refresh timing management unit 1012 can transmit a refresh command generation instruction for generating a per-bank refresh command to the refresh command generation unit 1013, depending on the value of the per-bank refresh control counter.

The execution period of the all-bank refresh is longer than the execution period of the per-bank refresh. In the execution period of the all-bank refresh, the memory controller 100 is unable to access the DRAM 110 for a long time. Thus, after the all-bank refresh, the refresh timing management unit 1012 asserts the refresh command generation instruction mask to secure a fixed period of time as the period in which the DRAM 110 can be accessed. During the period in which the refresh command generation instruction mask is asserted, the refresh timing management unit 1012 does not transmit a refresh command generation instruction to the refresh command generation unit 1013 even when the refresh timing management unit 1012 receives a refresh timing signal. The per-bank refresh is thereby prevented from being performed in this period, and thus the memory controller 100 can secure the fixed period of time as the period in which the DRAM 110 can be accessed, after the all-bank refresh.

In a case where the refresh timing management unit 1012 receives a refresh timing signal and the value of the timing adjustment detection counter at the time of the receipt is not (N−1), the refresh timing management unit 1012 can transmit a refresh command generation instruction, depending on the state of the refresh command generation instruction mask. More specifically, the refresh timing management unit 1012 transmits a refresh command generation instruction for generating a per-bank refresh command to the refresh command generation unit 1013 during the period in which the refresh command generation instruction mask is not asserted. On the other hand, the refresh timing management unit 1012 does not transmit the refresh command generation instruction to the refresh command generation unit 1013 during the period in which the refresh command generation instruction mask is asserted.

According to the present exemplary embodiment, the memory controller 100 generates a refresh command for the all-bank refresh or the per-bank refresh, depending on whether the execution timing for the timing adjustment and the calibration arrives. The timing adjustment and the calibration are performed during the execution of the all-bank refresh, and thus a reduction in the use efficiency of the DRAM 110 can be inhibited. During the execution of the per-bank refresh, the timing adjustment and the calibration are not performed and thus the reduction in the use efficiency of the DRAM 110 can be inhibited. During the period in which the refresh command generation instruction mask is asserted after the all-bank refresh, no refresh command generation instruction is transmitted and thus the use efficiency of the DRAM 110 can be improved.

Figure 4:
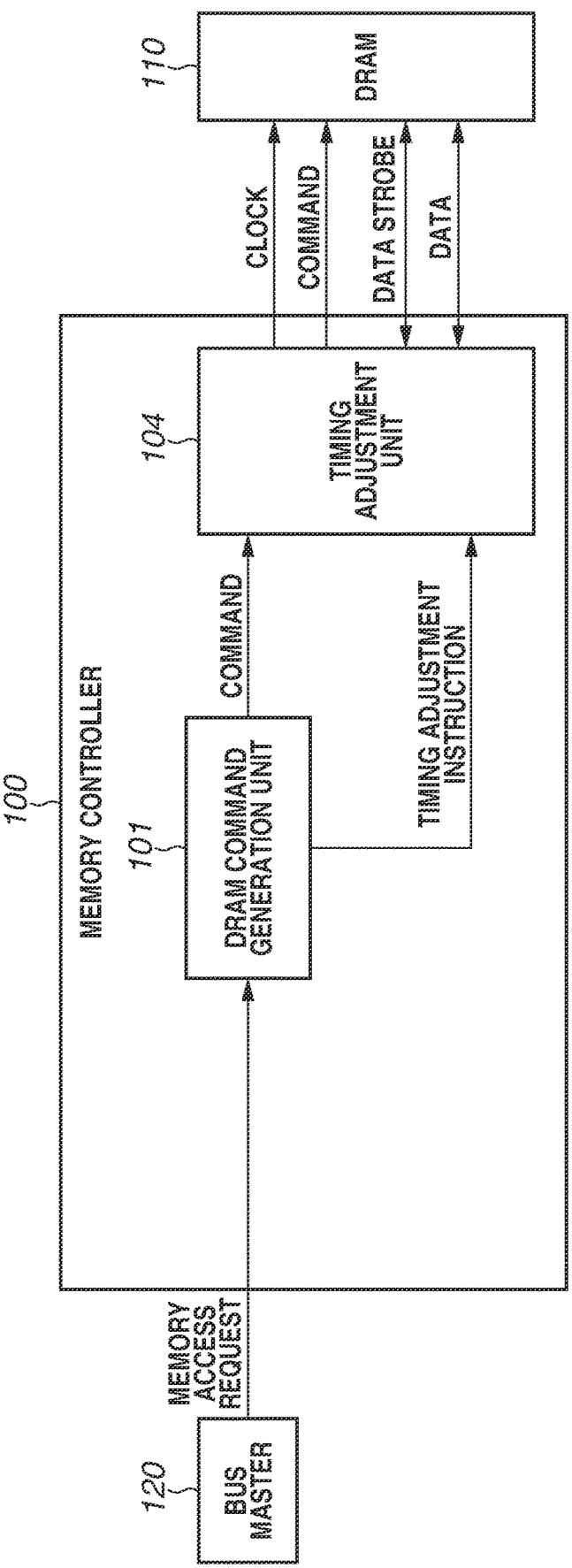
FIG. 4 is a diagram illustrating another example of the configuration of the memory controller.

FIG. 4 is a diagram illustrating an example of a configuration of the memory controller 100 according to a second exemplary embodiment. The present exemplary embodiment is different from the first exemplary embodiment in the configuration of the DRAM command generation unit 101, and deals with a case where the execution cycle of the timing adjustment and the calibration is not an integral multiple of the execution cycle of the per-bank refresh. In the present exemplary embodiment, differences from the first exemplary embodiment will be described.

The memory controller 100 in FIG. 4 is different from the memory controller 100 in FIG. 1 in that the refresh timing generation unit 102 and the timing adjustment instruction unit 103 are eliminated, and includes the DRAM command generation unit 101 and the timing adjustment unit 104.

The DRAM command generation unit 101 measures the execution cycle of the per-bank refresh and the execution cycle of the timing adjustment. When the execution timing for the per-bank refresh arrives, the DRAM command generation unit 101 determines whether the execution timing for the timing adjustment is to occur before the next execution timing for the per-bank refresh. The DRAM command generation unit 101 generates an all-bank refresh command if determining that the execution timing for the timing adjustment is to occur, and generates a per-bank refresh command if determining that the execution timing for the timing adjustment is not to occur. In the case of generating the all-bank refresh command, the DRAM command generation unit 101 transmits a timing adjustment instruction to the timing adjustment unit 104.

The timing adjustment unit 104 receives the timing adjustment instruction from the DRAM command generation unit 101. Then, the timing adjustment unit 104 executes the timing adjustment and the calibration between a clock signal and a command signal and between a data strobe signal and a data signal in order to communicate with the DRAM 110 appropriately.

Figure 5:
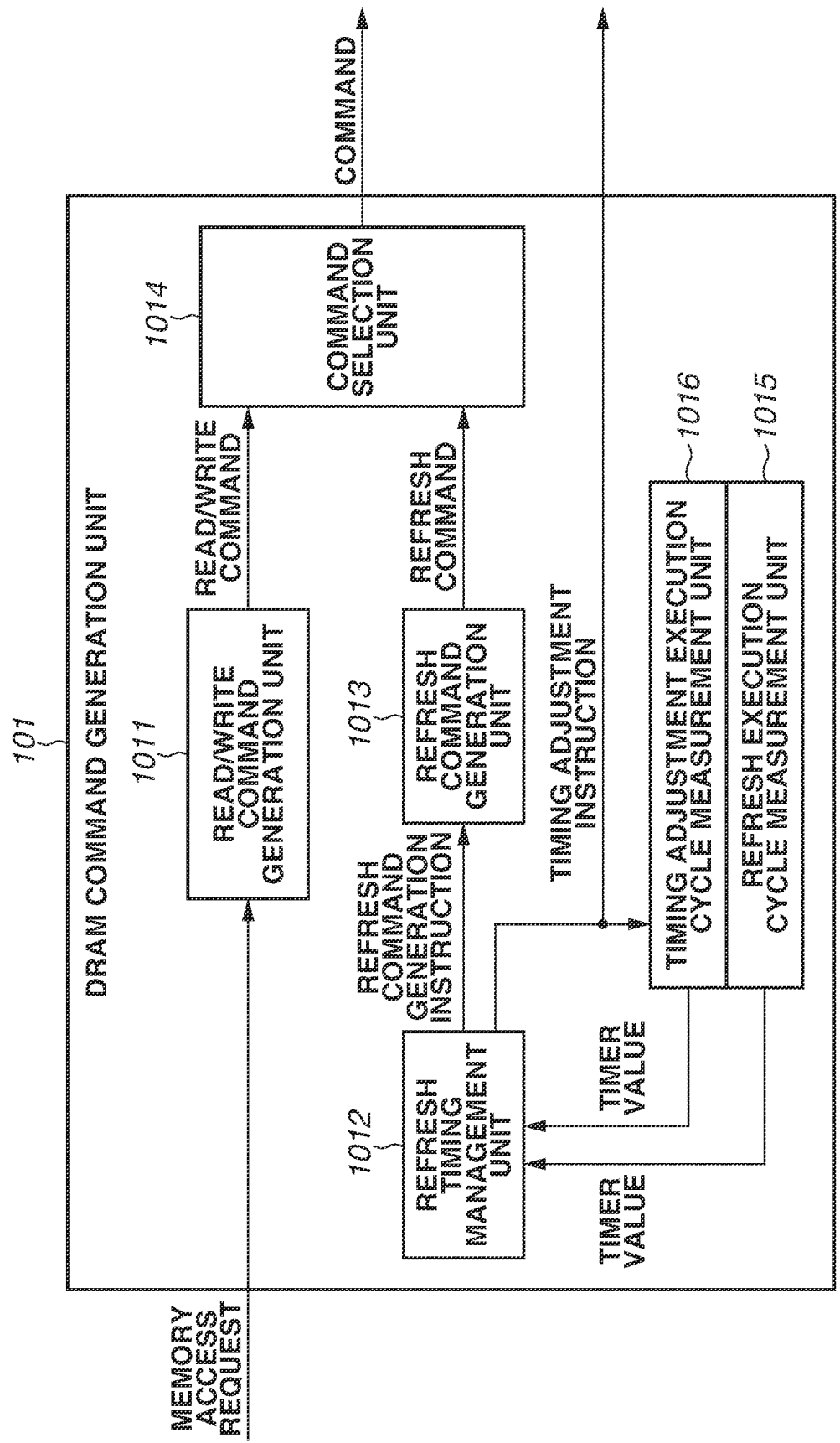
FIG. 5 is a diagram illustrating another example of the configuration of the DRAM command generation unit.

FIG. 5 is a diagram illustrating an example of a configuration of the DRAM command generation unit 101 according to the present exemplary embodiment. The DRAM command generation unit 101 includes the read/write command generation unit 1011, the refresh timing management unit 1012, the refresh command generation unit 1013, and the command selection unit 1014. The DRAM command generation unit 101 further includes a refresh execution cycle measurement unit 1015 and a timing adjustment execution cycle measurement unit 1016. The read/write command generation unit 1011, the refresh command generation unit 1013, and the command selection unit 1014 are similar to those in the first exemplary embodiment.

The refresh execution cycle measurement unit 1015 includes a countdown timer for measuring the execution cycle of the per-bank refresh. The initial value of the timer is the execution cycle of the per-bank refresh, and the refresh execution cycle measurement unit 1015 outputs the current timer value to the refresh timing management unit 1012. When the timer value becomes 0, the refresh execution cycle measurement unit 1015 resets the timer to the execution cycle of the per-bank refresh and starts the measurement again.

The timing adjustment execution cycle measurement unit 1016 includes a countdown timer for measuring the execution cycle of the timing adjustment. The initial value of the timer is the execution cycle of the timing adjustment, and the timing adjustment execution cycle measurement unit 1016 outputs the current timer value to the refresh timing management unit 1012. When the timer value becomes 0, the timing adjustment execution cycle measurement unit 1016 resets the timer to the execution cycle of the timing adjustment and starts the measurement again. The timing adjustment execution cycle measurement unit 1016 resets the timer to the timing execution cycle and starts the measurement again also in a case where the refresh timing management unit 1012 transmits a timing adjustment instruction.

The refresh timing management unit 1012 includes a per-bank refresh control counter. The per-bank refresh control counter is used to control issuing of a per-bank refresh command. The initial value of the per-bank refresh control counter is 0, and the per-bank refresh control counter counts up when the refresh execution cycle measurement unit 1015 measures the refresh execution cycle. The per-bank refresh control counter is cleared to 0 when the refresh execution cycle measurement unit 1015 measures the refresh execution cycle M times. M is a value calculated by dividing the total number of banks of the DRAM 110 by the number of banks to be refreshed by one per-bank refresh command.

When the timer value of the refresh execution cycle measurement unit 1015 becomes 0, the refresh timing management unit 1012 determines whether the timer value of the timing adjustment execution cycle measurement unit 1016 is more than or equal to the execution cycle of the per-bank refresh. The refresh timing management unit 1012 thereby determines whether the timing adjustment is to be executed between the current per-bank refresh execution and the next per-bank refresh execution.

First, a case where the timer value of the timing adjustment execution cycle measurement unit 1016 is more than or equal to the execution cycle of the per-bank refresh will be described. In this case, the refresh timing management unit 1012 transmits a refresh command generation instruction for generating a per-bank refresh command to the refresh command generation unit 1013.

Next, a case where the timer value of the timing adjustment execution cycle measurement unit 1016 is less than the execution cycle of the per-bank refresh will be described. In this case, the refresh timing management unit 1012 transmits a refresh command generation instruction for generating an all-bank refresh command to the refresh command generation unit 1013. At this time, in a case where the value of the per-bank refresh control counter is smaller than (M−1), the refresh timing management unit 1012 asserts the refresh command generation instruction mask for masking a refresh command generation instruction.

The refresh timing management unit 1012 does not transmit a refresh command generation instruction to the refresh command generation unit 1013 while the refresh command generation instruction mask is asserted. When the timer value of the refresh execution cycle measurement unit 1015 becomes 0 in a case where the value of the per-bank refresh control counter is the same as (M−1), the refresh command generation instruction mask is deasserted. The refresh timing management unit 1012 can transmit a refresh command generation instruction to the refresh command generation unit 1013 while the refresh command generation instruction mask is not asserted. Further, the refresh timing management unit 1012 transmits a timing adjustment instruction to the timing adjustment unit 104 in the case of transmitting the instruction for generating an all-bank refresh command.

According to the present exemplary embodiment, the memory controller 100 can deal with the case where the execution cycle of the timing adjustment and the calibration is not an integral multiple of the execution cycle of the per-bank refresh. The present exemplary embodiment can provide an effect similar to the effect of the first exemplary embodiment.

In each of the first and second exemplary embodiments, the timing adjustment unit 104 is described to execute the timing adjustment between the data strobe signal and the data signal, but may execute a timing adjustment between a clock signal for data to be output by the memory controller 100 and the data signal.

As described above, the memory controller 100 can select a refresh method from among a plurality of refresh methods varying in refresh target area of the DRAM 110. The plurality of refresh methods includes the all-bank refresh and the per-bank refresh. The all-bank refresh is a refresh method of refreshing the entire area of the DRAM 110. The per-bank refresh is a refresh method of refreshing part of the area of the DRAM 110.

In the memory controller 100, a specific event that disables access to the entire area of the DRAM 110 occurs in a cycle longer than the execution cycle of the all-bank refresh.

The specific event that disables the access to the entire area of the DRAM 110 is, for example, the timing adjustment or the calibration for the memory controller 100 to communicate with the DRAM 110.

The DRAM command generation unit 101 functions as a selection unit, and selects one refresh method from among the plurality of refresh methods depending on whether the specific event that disables the access to the entire area of the DRAM 110 is to occur in a refresh execution period. The refresh execution period is based on the refresh timing signal generated by the refresh timing generation unit 102 illustrated in FIG. 1, or based on the refresh execution cycle measured by the refresh execution cycle measurement unit 1015 illustrated in FIG. 5. The refresh execution period is provided with a predetermined cycle.

In a case where the specific event that disables the access to the entire area of the DRAM 110 is to occur in the refresh execution period, the DRAM command generation unit 101 selects the all-bank refresh. In a case where the specific event that disables the access to the entire area of the DRAM 110 is not to occur in the refresh execution period, the DRAM command generation unit 101 selects the per-bank refresh.

For example, the DRAM command generation unit 101 selects the all-bank refresh for each refresh execution period in which the timing adjustment or the calibration is to occur. The DRAM command generation unit 101 selects the per-bank refresh for each refresh execution period in which neither the timing adjustment nor the calibration is to occur.

Referring to FIG. 3, the DRAM command generation unit 101 selects the all-bank refresh for the refresh execution period that is based on the refresh timing signal received at the time T5. Then, the DRAM command generation unit 101 performs control not to refresh the DRAM 110 in one or a plurality of refresh execution periods immediately after the refresh execution period for which the all-bank refresh is selected. In this period, the refresh command generation instruction mask is asserted.

As described above, the memory controller 100 is connected to the DRAM 110, and can be used for various memory controllers each having a plurality of refresh methods varying in refresh target area. The memory controller 100 can inhibit the reduction of the memory use efficiency by selecting an appropriate refresh method from among the plurality of refresh methods, depending on whether the specific event such as the execution of the timing adjustment or the calibration is to occur in a refresh execution period.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-179351, filed Nov. 2, 2021, which is hereby incorporated by reference herein in its entirety.

What is claimed is:

1. A memory controller where at least one of a plurality of refresh methods varying in refresh target area of a dynamic random access memory (DRAM) is a refresh method of refreshing an entire area of the DRAM, and where a specific event that disables access to the entire area of the DRAM occurs in a cycle longer than a refresh execution cycle using the refresh method of refreshing the entire area of the DRAM, the memory controller comprising:
a selection unit configured to select one refresh method from among the plurality of refresh methods, depending on whether the specific event that disables the access to the entire area of the DRAM is to occur in a refresh execution period.

2. The memory controller according to claim 1, wherein the plurality of refresh methods includes the refresh method of refreshing the entire area of the DRAM, and a refresh method of refreshing part of the area of the DRAM.

3. The memory controller according to claim 2, wherein the selection unit selects the refresh method of refreshing the entire area of the DRAM in a case where the specific event that disables the access to the entire area of the DRAM is to occur in the refresh execution period, and selects the refresh method of refreshing part of the area of the DRAM in a case where the specific event that disables the access to the entire area of the DRAM is not to occur in the refresh execution period.

4. The memory controller according to claim 1, wherein the specific event that disables the access to the entire area of the DRAM is a timing adjustment or a calibration for communication with the DRAM.

5. The memory controller according to claim 3,
wherein the specific event that disables the access to the entire area of the DRAM is a timing adjustment or a calibration for communication with the DRAM,
wherein the refresh execution period is provided with a predetermined cycle, and
wherein, for each refresh execution period, the selection unit selects the refresh method of refreshing the entire area of the DRAM in a case where the timing adjustment or the calibration is to occur in the refresh execution period, and selects the refresh method of refreshing part of the area of the DRAM in a case where neither the timing adjustment nor the calibration is to occur in the refresh execution period.

6. The memory controller according to claim 5, wherein the selection unit performs control not to refresh the DRAM in one or a plurality of refresh execution periods immediately after a refresh execution period for which the refresh method of refreshing the entire area of the DRAM is selected.

7. A control method for a memory controller where at least one of a plurality of refresh methods varying in refresh target area of a dynamic random access memory (DRAM) is a refresh method of refreshing an entire area of the DRAM, and where a specific event that disables access to the entire area of the DRAM occurs in a cycle longer than a refresh execution cycle using the refresh method of refreshing the entire area of the DRAM, the control method comprising:
selecting one refresh method from among the plurality of refresh methods, depending on whether the specific event that disables the access to the entire area of the DRAM is to occur in a refresh execution period.

8. A non-transitory computer-readable storage medium storing a program for causing a memory controller to execute a control method, wherein, in the memory controller, at least one of a plurality of refresh methods varying in refresh target area of a dynamic random access memory (DRAM) is a refresh method of refreshing an entire area of the DRAM, and a specific event that disables access to the entire area of the DRAM occurs in a cycle longer than a refresh execution cycle using the refresh method of refreshing the entire area of the DRAM, the control method comprising:
selecting one refresh method from among the plurality of refresh methods, depending on whether the specific event that disables the access to the entire area of the DRAM is to occur in a refresh execution period.

* * * * *